United States Patent [19]

Yoshimura et al.

[11] Patent Number: 4,781,989

[45] Date of Patent: Nov. 1, 1988

[54] SURFACE-COATED CUTTING MEMBER

[75] Inventors: Hironori Yoshimura, Yokohama; Munenori Kato, Tokyo, both of Japan

[73] Assignee: Mitsubishi Kinzoku Kabushiki Kaisha, Tokyo, Japan

[21] Appl. No.: 22,278

[22] Filed: Mar. 5, 1987

[30] Foreign Application Priority Data

Mar. 7, 1986 [JP] Japan .................................. 61-50000
Mar. 12, 1986 [JP] Japan .................................. 61-53968
Mar. 12, 1986 [JP] Japan .................................. 61-53969

[51] Int. Cl.$^4$ .............................................. B22F 7/02
[52] U.S. Cl. ..................................... 428/552; 428/564
[58] Field of Search .................. 428/552, 564; 51/297, 51/309

[56] References Cited

U.S. PATENT DOCUMENTS

| | | |
|---|---|---|
| 3,791,852 | 2/1974 | Bunshah . |
| 4,035,541 | 7/1977 | Smith et al. ........................ 428/552 |
| 4,101,703 | 7/1978 | Schintlmeister ..................... 428/552 |
| 4,268,582 | 5/1981 | Hale et al. ............................ 428/552 |
| 4,337,300 | 6/1982 | Itaba et al. . |
| 4,450,205 | 5/1984 | Itaba et al. . |
| 4,554,201 | 11/1985 | Andreev et al. ..................... 428/699 |

FOREIGN PATENT DOCUMENTS 53-70905  6/1978  Japan ................................... 428/564

Primary Examiner—John F. Terapane
Assistant Examiner—Eric Jorgensen
Attorney, Agent, or Firm—Scully, Scott, Murphy & Presser

[57] ABSTRACT

A surface-coated cutting member includes a substrate, a metal layer vapor-deposited on a surface of the substrate and a hard coating vapor-deposited on the metal layer. The substrate is made of hard material selected from the group consisting of tungsten carbide-based cemented carbide, titanium carbo-nitride based cermet and high speed steel. The metal layer is made of metal selected from Group IVa of the Periodic Table and has an average thickness of 0.1 to 1 $\mu$m. The hard coating has an average thickness of 1 to 9 $\mu$m, and includes an inner layer of an average thickness of 0.2 to 4 $\mu$m vapor-deposited on the metal layer, an intermediate layer of an average thickness of 0.2 to 4 $\mu$m vapor-deposited on the inner layer and an outer layer of an average thickness of 0.2 to 3 $\mu$m vapor-deposited on the intermediate layer. The inner layer is made of carbide or carbo-nitride of metal selected from Group IVa of the Periodic Table, and the intermediate layer is made of carbo-nitride of metal selected from Group IVa of the Periodic Table. The outer layer is made of nitride of metal selected from Group IVa of the Periodic Table.

5 Claims, No Drawings

SURFACE-COATED CUTTING MEMBER

BACKGROUND OF THE INVENTION

1. Field of the Invention

The present invention relates to a surface-coated cutting member in which the bonding of a hard coating to a substrate is enhanced so highly that the hard coating is hardly subjected to separation, thereby exhibiting excellent wear-resistance over a prolonged period of time.

2. Prior Art

There have been extensively used surface-coated cutting members each of which comprises a substrate made of a hard material of tungsten carbide-based cemented carbide, titanium carbo-nitride based cermet or high speed steel, and a hard coating formed on a surface of the substrate and comprising one or more layers each composed of one or more carbide of metal in Groups IVa, Va or VIa of the Periodic Table, nitride of metal in Groups IVa or Va of the Periodic Table, oxide of metal in Group IVa of the Periodic Table, and solid solution of two or more of these compounds.

Each conventional cutting member mentioned above, however, has been found that the bonding of the hard coating to the substrate is not sufficient. Consequently, when the cutting member is used to carry out a heavy-duty cutting operation such as high-speed cutting, high-feed cutting, deep cutting and the like, the hard coating is subjected to separation or wear after a relatively short time to result in a short tool life of the cutting member.

It is therefore an object of the present invention to provide a surface-coated cutting member in which the bonding of a hard coating to a substrate is highly enhanced to provide a high wear-resistance.

According to the present invention, there is provided a surface-coated cutting member comprising a substrate of hard material selected from the group consisting of tungsten carbide-based cemented carbide, titanium carbo-nitride based cermet and high speed steel, a layer of metal vapor-deposited on a surface of the substrate and having an average thickness of 0.1 to 1 $\mu$m, the metal being selected from Group IVa of the Periodic Table, and a hard coating vapor-deposited on the metal layer and having an average thickness of 1 to 9 $\mu$m, the hard coating consisting of an inner layer of an average thickness of 0.2 to 4 $\mu$m vapor-deposited on the metal layer, an intermediate layer of an average thickness of 0.2 to 4 $\mu$m vapor-deposited on the inner layer and an outer layer of an average thickness of 0.2 to 3 $\mu$m vapor-deposited on the intermediate layer, the inner layer being made of carbide or carbo-nitride of metal selected from Group IVa of the Periodic Table, the intermediate layer being made of carbo-nitride of metal selected from Group IVa of the Periodic Table, the outer layer being made of nitride of metal selected from Group IVa of the Periodic Table.

DESCRIPTION OF THE INVENTION

In a cutting member in accordance with the present invention, a metal layer of titanium, zirconium or hafnium is formed by physical vapor deposition on a surface of a substrate made of tungsten carbide-based cemented carbide, titanium carbo-nitride based cermet or high speed steel, and a hard coating including an inner layer of carbide of such metal is formed on the metal layer by physical vapor deposition. With this construction, the strength of bonding between the substrate and the metal layer is high, and also the strength of bonding between the metal layer and the hard coating is high. Thus, the strength of bonding of the hard coating to the substrate is substantially enhanced through the metal layer interposed therebetween. The metal positively combines with the substrate. Also, the reason why the strength of bonding between the metal layer and the inner layer of the hard coating is high is that metal element is quite active and that these two layers have common metal elements or similar elements belonging to Group IVa of the Periodic Table.

Further, in addition to the inner layer of metal carbide, the hard coating includes an intermediate layer of carbonitride of titanium, zirconium or hafnium and an outer layer of nitride of such metal. With this specific construction, as well as the strength of bonding between the hard coating and the substrate, the strength of bonding between the respective layers of the hard coating is highly enhanced to provide the hard coating which is hardly subjected to separation even in the heavy-duty cutting operation. The reason why the strength of bonding between the respective layers of the hard coating is high is that carbide of the inner layer has higher affinity for the metal of the metal layer while nitride of the outer layer has lower affinity for the metal, and that the intermediate layer includes both carbon and nitrogen, so that carbo-nitride of the intermediate layer is bonded to the outer and inner layers, respectively, with sufficient strength in the process of physical vapor deposition.

The provision of the respective layers of the hard coating has other advantages. Specifically, the inner layer of metal carbide has an advantage of enhancing the resistance of a cutting edge to flank wear since the metal carbide exhibits such a great hardness as to prevent the coating from being adversely affected by abrasion during cutting operation. The intermediate layer of metal carbo-nitride imparts an increased resistance to crater wear to the cutting edge of the cutting member. Further, by virtue of the provision of the outer layer of metal nitride, the cutting edge of the cutting member becomes more resistant to adhesion since nitride of the outer layer has less affinity for a metal workpiece during cutting operation.

Consequently, the hard coating of the surface-coated cutting member in accordance with the present invention is not subjected to separation, and besides exhibits excellent resistance to flank wear, crater wear and adhesion, to thereby provide excellent wear-resistance over a remarkably prolonged period of time.

Further, in the cutting member of the above structure, the average thickness of the metal layer should range from 0.1 to 1.0 $\mu$m. If the average thickness thereof is less than 0.1 $\mu$m, metal in the metal layer changes to metal carbide when vapor-depositing the inner layer of carbide on the metal layer. As a result, there arises such a situation that no metal layer exists actually, so that the hard coating fails to have desired excellent bonding to the substrate. On the other hand, if the average thickness exceeds 1 $\mu$m, the cutting member becomes less resistant to wear.

In addition, the average thicknesses of the inner layer, the intermediate layer and the outer layer of the hard coating should range from 0.2 to 4 $\mu$m, from 0.2 to 4 $\mu$m and from 0.2 to 3 $\mu$m, respectively. If the average thickness of each layer is less than the lower limit, each layer fails to impart sufficient wear-resistance to the cutting edge as desired. On the other hand, if the average thickness of each layer exceeds the upper limit, crystal particles vapor-deposited in each layer become so large that each layer becomes brittle and less tough, to result in a lower resistance of the cutting edge to fracturing and chipping.

Further, the overall hard coating should have an average thickness of 1 to 9 μm. If the average thickness is less than 1 μm, the cutting member fails to have sufficient wear-resistance. On the other hand, if the average thickness exceeds 9 μm, the cutting member becomes less resistant to fracturing and chipping.

Although it is preferable that the inner layer of the hard coating is made of carbide of such metal as titanium, zirconium and hafnium, the inner layer may be made of carbonitride of such metal as long as the content of nitrogen is comparatively small relative to the content of carbon to such an extent that an atomic ratio of the nitrogen to carbon is less than 0.5. In such a case, the hard coating includes two layers of carbo-nitride of metal, but the carbo-nitride of metal of the intermediate layer should be such that the content of nitrogen is large relative to the content of carbon so that the atomic ratio of nitrogen to carbon is practically not less than 0.5.

The invention will now be illustrated by the following examples.

EXAMPLE 1

There were prepared, as substrates, members conforming in shape to a cutting member of JIS.SNP 432 (ISO.SNGN 120408) and made of tungsten carbide-based cemented carbide of ISO.P 30. A titanium layer and a hard coating consisting of three layers of titanium compounds were vapor-deposited on each of the substrates by using a conventional physical vapor deposition apparatus to provide surface-coated cutting members 1 to 14 (hereinafter referred to as "the cutting members of this invention") as shown in Table 1. For comparison purposes, layers as shown in Table 1 were also vapor-deposited on the substrates to provide comparative surface-coated cutting members 1 to 12 (hereinafter referred to as "comparative cutting members").

The cutting members 1 to 14 of this invention and the comparative cutting members 1 to 12 were subjected to a continuous cutting test in a lathe. The conditions for this continuous cutting test were as follows:
Workpiece: a steel bar of a circular cross-section (JIS.SNCM439; Hardness: HB 230)
Cutting speed: 130 m/minute
Feed rate: 0.36 mm/revolution
Depth of cut: 1.5 mm
Time of cutting: 15 minutes An intermittent cutting test in a lathe was also carried out under the following conditions:
Workpiece: a steel block for engagement with the cutting member (JIS.SNCM439; Hardness: HB 270)
Cutting speed: 100 m/minute
Feed rate: 0.375 mm/revolution
Depth of cut: 3 mm
Time of cutting: 2 minutes In the continuous cutting test, the width of flank wear and the depth of crater wear were respectively measured. In the intermittent cutting test, it was determined how many cutting members of the same construction out of ten were subjected to chipping.

The results obtained are given in Table 2.

As seen from Table 2, the cutting members 1 to 14 of this invention not only exhibited sufficient resistances to both flank and crater wear, but also were less susceptible to chipping. On the other hand, some of the tested comparative cutting members exhibited very low resistance to either flank wear or crater wear while others were subjected to chipping many times. Some of the comparative cutting members were even

TABLE 1

| Kind of cutting member | | Average thickness (μm) | | | | |
|---|---|---|---|---|---|---|
| | | Metal layer | Hard coating | | | |
| | | | TiC | TiCN | TiN | Total |
| Cutting members of this invention | 1 | 0.2 | 0.3 | 1.6 | 0.4 | 2.3 |
| | 2 | 0.5 | 2.0 | 1.0 | 0.5 | 3.5 |
| | 3 | 0.6 | 3.5 | 0.5 | 0.2 | 4.2 |
| | 4 | 0.4 | 2.6 | 0.2 | 0.8 | 3.6 |
| | 5 | 0.3 | 0.6 | 3.8 | 0.2 | 4.6 |
| | 6 | 0.5 | 1.5 | 2.3 | 2.9 | 6.7 |
| | 7 | 0.3 | 0.8 | 0.3 | 3.0 | 4.1 |
| | 8 | 0.1 | 0.2 | 0.6 | 0.6 | 1.4 |
| | 9 | 0.2 | 0.8 | 0.6 | 0.3 | 1.7 |
| | 10 | 0.2 | 0.7 | 1.0 | 0.5 | 2.2 |
| | 11 | 0.8 | 3.3 | 2.4 | 1.8 | 7.5 |
| | 12 | 1.0 | 3.9 | 1.7 | 3.0 | 8.6 |
| | 13 | 0.2 | 0.6(TiCN) | 1.5 | 1.0 | 3.1 |
| | 14 | 0.4 | 1.0(TiCN) | 1.2 | 1.4 | 3.6 |
| Comparative cutting members | 1 | —* | 2.0 | 1.1 | 0.3 | 3.4 |
| | 2 | 1.3* | 2.2 | 0.6 | 0.5 | 3.3 |
| | 3 | 0.3 | —* | 0.6 | 0.3 | 0.9 |
| | 4 | 0.3 | 4.4* | 1.7 | 2.6 | 8.7 |
| | 5 | 0.4 | 0.5 | —* | 0.8 | 1.3 |
| | 6 | 0.3 | 2.5 | 4.3* | 1.7 | 8.5 |
| | 7 | 0.2 | 0.8 | 0.8 | —* | 1.6 |
| | 8 | 0.8 | 3.2 | 1.2 | 3.6* | 8.0 |
| | 9 | 0.1 | 0.2 | 0.2 | 0.2 | 0.6* |
| | 10 | 0.9 | 3.8 | 3.7 | 1.6 | 9.9* |
| | 11 | —* | —* | —* | 3.0 | 3.0 |
| | 12 | —* | —* | 2.3 | 2.2 | 4.5 |

"*" denotes a value deviated from the prescribed range of the invention.

TABLE 2

| Kind of cutting member | | Continuous cutting | | Intermittent cutting Number of chipped cutting members/ number of tested cutting members |
|---|---|---|---|---|
| | | Width of flank wear (mm) | Depth of crater wear (μm) | |
| Cutting members of this invention | 1 | 0.22 | 70 | 0/10 |
| | 2 | 0.10 | 40 | 1/10 |
| | 3 | 0.08 | 50 | 2/10 |
| | 4 | 0.10 | 50 | 1/10 |
| | 5 | 0.14 | 40 | 2/10 |
| | 6 | 0.11 | 30 | 3/10 |
| | 7 | 0.18 | 35 | 2/10 |
| | 8 | 0.29 | 80 | 0/10 |
| | 9 | 0.21 | 80 | 0/10 |
| | 10 | 0.19 | 70 | 0/10 |
| | 11 | 0.07 | 25 | 4/10 |
| | 12 | 0.07 | 20 | 5/10 |
| | 13 | 0.10 | 40 | 1/10 |
| | 14 | 0.11 | 40 | 1/10 |
| | 15 | 0.10 | 30 | 2/10 |
| Comparative cutting members | 1 | separation developed | separation developed | 10/10 |
| | 2 | 0.59 | 150 | 5/10 |
| | 3 | 0.40 | 100 | 0/10 |
| | 4 | 0.07 | 20 | 10/10 |
| | 5 | 0.36 | 100 | 1/10 |
| | 6 | 0.10 | 25 | 10/10 |
| | 7 | 0.35 | 100 | 1/10 |
| | 8 | 0.09 | 20 | 10/10 |
| | 9 | 0.53 | 120 | 0/10 |
| | 10 | 0.07 | 20 | 10/10 |
| | 11 | 0.49 | 90 | 9/10 |
| | 12 | separation developed | separation developed | 10/10 |
| | 15 | 0.29 | 50 | 10/10 |

EXAMPLE 2

There was prepared, as a substrate, a member conforming in shape to a cutting member of JIS.SNP 432 and made of titanium carbo-nitride based cermet having a chemical composition of 58% TiC-15% TiN-12% Mo$_2$C-15% Ni. A Ti layer having an average thickness of 0.3 μm and a hard coating having an average thickness of 2.2 μm and consisting of an inner layer of TiC having an average thickness 1.0 μm, an intermediate layer of TiCN having an average thickness of 0.7 μm and an outer layer of TiN having an average thickness of 0.5 μm were vapor-deposited on the substrate by using a physical vapor deposition apparatus to provide a surface-coated cutting member 15 of this invention.

For comparison purposes, a comparative cutting member 15 was prepared according to the above procedure except that the hard coating consisted only of a TiN layer having an average thickness of 2 μm.

As is the case with Example 1, the cutting member 15 of this invention and the comparative cutting member 15 were subjected to continuous and intermittent cutting tests, respectively. The conditions for the continuous cutting test were the same as those in Example 1 except that the cutting speed was 180 m/minute. On the other hand, the conditions for the intermittent cutting test were as follows:
Workpiece: a steel block for engagement with the cutting member (JIS.SNCM439; Hardness HB: 230)
Cutting speed: 150 m/minute
Feed rate: 0.19 mm/revolution
Depth of cut: 2 mm
Time of cutting: 2 minutes Similarly to the case with Example 1, the width of flank wear and the depth of crater wear were measured in the continuous cutting test while in the intermittent cutting test, it was determined how many cutting members of the same construction out of ten were subjected to chipping.

The results obtained are also given in Table 2.

As seen from Table 2, the cutting member 15 of the present invention exhibited sufficiently high resistance to both flank and crater wear, and only two of the tested cutting members 15 were subjected to chipping. On the other tand, the comparative cutting member exhibited resistance to flank and crater wear substantially lower than that of the cutting member of this invention, and all of the tested comparative cutting members were subjected to chipping.

EXAMPLE 3

There was prepared, as a substrate, a member conforming in shape to a two-flute end mill having a diameter of 8 mm and made of high speed steel (JIS.SKH55). A metal Ti layer having an average thickness of 0.2 μm and a hard coating having an average thickness of 2.9 μm and consisting of an inner layer of TiC having an average thickness 0.9 μm, an intermediate layer of TiCN having an average thickness of 1.2 μm and an outer layer of TiN having an average thickness of 0.8 μm were vapor-deposited on the substrate by using a physical vapor deposition apparatus to provide a surface-coated cutting member 16 of this invention.

As is the case with Example 2, a comparative cutting member 16 was also prepared according to the above procedure except that the hard coating consisted only of a TiN layer having an average thickness of 3 μm.

Then, the cutting member 16 of this invention and the comparative cutting member 16 were subjected to a cutting test under the following conditions:
Workpiece: alloyed steel (JIS.SKD61; Hardness: HRC 35)
Cutting speed: 40 m/minute
Feed rate: 0.015 mm/revolution
Depth of cut: 7 mm In the test, it was determined what was the length of a portion of the workpiece cut by each cutting member until the flank of the cutting member was worn 0.3 mm. The cutting member of this invention could cut the workpiece by 37 m, but the comparative cutting member cut it by only 20 m.

EXAMPLE 4

Members similar to those described in Example 1 were prepared as substrates. And, a zirconium layer and a hard coating consisting of three layers of metal compounds were vapor-deposited on each of the substrates by using a conventional physical vapor deposition apparatus to provide surface-coated cutting members 17 to 19 as shown in Table 3. For comparison purposes, layers as described in Table 3 were also vapor-deposited on the substrates to provide comparative surface-coated cutting members 17 and 18.

The cutting members 17 to 19 of this invention and the comparative cutting members 17 and 18 were subjected to a continuous cutting test under the same conditions as those in Example 1 except that the cutting speed was 140 m/minute and that the time of cutting was 20 minutes. And, an intermittent cutting test was also carried out under the same conditions as those in Example 1 except that the cutting speed was 120 m/minute and that the feed rate was 0.3 mm/revolution.

Similarly to the case with Example 1, the width of flank wear and the depth of crater wear were measured in the continuous cutting test while in the intermittent cutting test, it was determined how many cutting members of the same construction out of ten were subjected to chipping.

The results obtained are given in Table 4.

As can be seen from Table 4, each of the cutting members 17 to 19 of this invention exhibited a quite high resistance to both flank and crater wear, and at the most, one tested cutting member was subjected to chipping in the intermittent cutting test of the cutting members 17 to 19. On the other hand, the comparative cutting member 17 exhibited an extremely low resistance to crater wear, and seven tested members were subjected to chipping. Further, the comparative cutting member 18 was subjected to fracturing in 5 minutes, and all the tested members were subjected to chipping.

TABLE 3

| Kind of cutting member | Kind of metal layer & average thickness (μm) | | Kind of hard coating & average thickness (μm) | | | |
|---|---|---|---|---|---|---|
| | | | Inner layer | Intermediate layer | Outer layer | Total thickness |
| Cutting members of this invention | 17 | Zr 0.4 | ZrC 1.9 | ZrCN 2.3 | ZrN 0.8 | 5.0 |
| | 18 | Zr 0.6 | TiC 2.8 | TiCN 1.5 | TiN 1.0 | 5.3 |
| | 19 | Zr 0.3 | ZrCN 1.5 | ZrCN 1.7 | ZrN 1.0 | 4.2 |
| | 20 | Hf 0.4 | HfC 1.8 | HfCN 1.5 | HfN 0.7 | 4.0 |
| | 21 | Hf | ZrC | ZrCN | ZrN | |

TABLE 3-continued

| Kind of cutting member | # | Kind of metal layer & avg thickness (μm) | Inner layer | Intermediate layer | Outer layer | Total thickness |
|---|---|---|---|---|---|---|
| | | | 0.4 | 1.8 | 2.6 | 0.9 | 
| | 22 | Hf | TiC | TiCN | TiN | — |
| | | 0.6 | 3.2 | 2.5 | 1.2 | 6.9 |
| | 23 | Hf | HfCN | HfCN | HfN | — |
| | | 0.3 | 1.5 | 2.2 | 1.1 | 4.8 |
| Comparative cutting members | 17 | Zr | TiN | TiCN | — | |
| | | 1.4* | 1.8 | 1.9 | — | 3.7 |
| | 18 | Zr | TiN | TiCN | — | |
| | | 0.3 | 6.2* | 6.7* | — | 12.9* |
| | 20 | Hf | ZrCN | ZrN | — | |
| | | 1.4* | 1.5 | 0.7 | — | 2.2 |
| | 21 | Hf | TiCN | TiN | — | |
| | | 0.4 | 6.0* | 6.8* | — | 12.8* |
| | 22 | Hf | HfN | ZrCN | — | |
| | | 0.6 | 6.4* | 6.7* | — | 13.1* |

"*" denotes a value deviated from the prescribed range of the invention.

TABLE 4

| Kind of cutting member | # | Continuous cutting Width of flank wear (mm) | Continuous cutting Depth of crater wear (μm) | Intermittent cutting Number of chipped cutting members/ number of tested cutting members |
|---|---|---|---|---|
| Cutting members of this invention | 17 | 0.10 | 20 | 1/10 |
| | 18 | 0.13 | 30 | 1/10 |
| | 19 | 0.12 | 20 | 0/10 |
| | 20 | 0.08 | 20 | 1/10 |
| | 21 | 0.10 | 30 | 1/10 |
| | 22 | 0.16 | 40 | 3/10 |
| | 23 | 0.10 | 20 | 1/10 |
| Comparative cutting members | 17 | 0.60 | 150 | 7/10 |
| | 18 | fractured in 5 minutes | | 10/10 |
| | 20 | 0.58 | 160 | 8/10 |
| | 21 | fractured in 3 minutes | | 10/10 |
| | 22 | fractured in 4 minutes | | 10/10 |

EXAMPLE 5

Members similar to those described in Example 1 were prepared as substrates. And, a hafnium layer and a hard coating consisting of three layers of metal compounds were vapor-deposited on each substrate by using a physical vapor deposition apparatus to provide surface-coated cutting members 20 to 23 as shown in Table 3. For comparison purposes, layers as described in Table 3 were also vapor-deposited on the substrates to provide comparative surface-coated cutting members 20 to 22.

Similarly to the case with Example 1, the cutting members 20 to 23 of this invention and the comparative cutting members 20 to 22 were subjected to continuous and intermittent cutting tests. The conditions for the continuous cutting test were the same as those in Example 1 except that the hardness of the workpiece is 260 and that the cutting speed was 140 m/minute. On the other hand, the conditions for the intermittent cutting test were as follows:

Workpiece: a steel block for engagement with the cutting member (JIS.SNCM439; Hardness HB: 300)
Cutting speed: 110 m/minute
Feed rate: 0.265 mm/revolution
Depth of cut: 2 mm
Time of cutting: 2 minutes Similarly to the case with Example 1, the width of flank wear and the depth of crater wear were measured in the continuous cutting test while in the intermittent cutting test, it was determined how many cutting members of the same construction out of ten were subjected to chipping.

The results obtained are also given in Table 4.

As can be seen from Table 4, each of the cutting members 20 to 23 of this invention exhibited a quite high resistance to both flank and crater wear, and only one of three tested cutting members were subjected to chipping. On the other hand, the comparative cutting member 20 exhibited an extremely low resistance to crater wear, and in the intermittent cutting test, eight tested members were subjected to chipping. Further, the comparative cutting members 21 and 22 were subjected to fracturing after a short time, and all the tested members were subjected to chipping.

As described above, in the surface-coated cutting member in accordance with the present invention, the strength of bonding of the hard coating to the substrate is highly enhanced through the metal layer interposed therebetween, and the hard coating comprises three layers bonded to each other with high strength. Besides, the respective layers of the hard coating by themselves exhibit excellent wear-resistance. Consequently, the cutting member in accordance with the present invention is hardly subjected to separation or fracturing, and exhibits excellent wear-resistance over a prolonged period of time.

What is claimed is:

1. A surface-coated cutting member comprising:
   (a) a substrate of hard material selected from the group consisting of tungsten carbide-based cemented carbide, titanium carbo-nitride based cermet and high speed steel;
   (b) a metal layer of zirconium vapor-deposited on a surface of the substrate and having an average thickness of 0.1 to 1 μm; said
   (c) a hard coating vapor-deposited on the zirconium layer and having an average thickness of 1 to 9 μm, said coating consisting of an inner layer of an average thickness of 0.2 to 4 μm vapor-deposited on the zirconium layer, an intermediate layer of an average thickness of 0.2 to 4 μm vapor-deposited on the inner layer and an outer layer of an average thickness of 0.2 to 3 μm vapor-deposited on the intermediate layer, said inner layer being made of carbide of metal selected form Group IVa of the Periodic Table, said intermediate layer being made of carbon-nitride of metal selected from Group IVa of the Periodic Table, said outer layer being made of nitride of metal selected from Group IVa of the Periodic Table, wherein each layer is vapor-deposited through a physical vapor deposition process.

2. A surface-coated cutting member comprising:
   (a) a substrate of hard material selected from the group consisting of tungsten carbide-based cemented carbide, titanium carbo-nitride based cermet and high speed steel;
   (b) a metal layer of zirconium vapor-deposited on a surface of the substrate and having an average thickness of 0.1 to 1 μm; and
   (c) a hard coating vapor-deposited on the zirconium layer and having an average thickness of 1 to 9 μm, said coating consisting of an inner layer of an average thickness of 0.2 to 4 μm vapor-deposited on the zirconium layer, an intermediate layer of an average thickness of 0.2 to 4 μm vapor-deposited on the inner layer and an outer layer of an average thickness of 0.2 to 3 μm vapor-deposited on the intermediate layer, said inner layer being made of carbo-nitride of metal selected from Group IVa of the Periodic Table, said intermediate layer being made of carbo-nitride of metal selected form Group IVa of the Periodic Table, said outer layer being made of nitride of metal selected from Group IVa of the Periodic Table, wherein each layer is vapor-deposited through a physical vapor deposition process.

3. A surface-coated cutting member comprising:
(a) a substrate of hard material selected from the group consisting of tungsten carbide-based cemented carbide, titanium carbo-nitride based cermet and high speed steel;
(b) a metal layer of hafnium vapor-deposited on a surface of the substrate and having an average thickness of 0.1 to 1 μm; and
(c) a hard coating vapor-deposited on the hafnium layer and having an average thickness of 1 to 9 μm, said coating consisting of an inner layer of an average thickness of 0.2 to 4 μm vapor-deposited on the hafnium layer, an intermediate layer of an average thickness of 0.2 to 4 μm vapor deposited on the inner layer and an outer layer of an average thickness of 0.2 to 3 μm vapor-deposited on the intermediate layer, said inner layer being made of carbide of metal selected from Group IVa of the Periodic Table, said intermediate layer being made of carbo-nitride of metal selected from Group IVa of the Periodic Table, said outer layer being made of nitride of metal selected from Group IVa of the Periodic Table, wherein each layer is vapor-deposited through a physical vapor deposition process.

4. A surface-coated cutting member comprising:
(a) a substrate of hard material selected from the group consisting of tungsten carbide-based cemented carbide, titanium carbo-nitride based cermet and high speed steel;
(b) a metal layer of hafnium vapor-deposited on a surface of the substrate and having an average thickness of 0.1 to 1 μm; and
(c) a hard coating vapor-deposited on the hafnium layer and having an average thickness of 1 to 9 μm, said coating consisting of an inner layer of an average thickness of 0.2 to 4 μm vapor-deposited on the hafnium layer, an intermediate layer of an average thickness of 0.2 to 4 μm vapor-deposited on the inner layer and an outer layer of an average thickness of 0.2 to 3 μm vapor-deposited on the intermediate layer, said inner layer being made of carbo-nitride of metal selected from Group IVa of the Periodic Table, said outer layer being made of nitride of metal selected from Group Va of the Periodic Table, wherein each layer is vapor-deposited through a physical vapor deposition process.

5. A surface-coated cutting member according to claim 1, 2, 3 or 4, in which said inner layer is made of such carbo-nitride that an atomic ratio of nitrogen to carbon is less than 0.5, an atomic ratio of nitrogen to carbon in the intermediate layer being not less than 0.5.

* * * * *

UNITED STATES PATENT AND TRADEMARK OFFICE
CERTIFICATE OF CORRECTION

PATENT NO. : 4,781,989
DATED : November 1, 1988
INVENTOR(S) : Hironori Yoshimura, et al.

It is certified that error appears in the above-identified patent and that said Letters Patent is hereby corrected as shown below:

Column 4, line 6: "were even" should read as --were even subjected to separation.--.

Column 5, line 46: "other tand," should read as --other hand,--

Column 8, line 37, Claim 1: "said" should read as --and--

Column 10, line 22, Claim 4: "Group Va" should read as --Group IVa--

Signed and Sealed this

Twenty-third Day of January, 1990

Attest:

JEFFREY M. SAMUELS

Attesting Officer     Acting Commissioner of Patents and Trademarks